(12) United States Patent
Trakimas et al.

(10) Patent No.: US 10,551,451 B2
(45) Date of Patent: Feb. 4, 2020

(54) RECONFIGURABLE ANALOG FRONT-END FOR INTEGRATED RECEIVER AND SENSOR APPLICATIONS

(71) Applicants: Michael Trakimas, Cambridge, MA (US); Alexander Alexeyev, Beverly, MA (US)

(72) Inventors: Michael Trakimas, Cambridge, MA (US); Alexander Alexeyev, Beverly, MA (US)

(73) Assignee: WaveGuide Corporation, Cambridge, MA (US)

( * ) Notice: Subject to any disclaimer, the term of this patent is extended or adjusted under 35 U.S.C. 154(b) by 0 days.

(21) Appl. No.: 15/935,717

(22) Filed: Mar. 26, 2018

(65) Prior Publication Data
US 2018/0275231 A1    Sep. 27, 2018

Related U.S. Application Data

(60) Provisional application No. 62/476,981, filed on Mar. 27, 2017.

(51) Int. Cl.
*G01R 33/36* (2006.01)
*G01R 33/54* (2006.01)
*G01R 33/30* (2006.01)

(52) U.S. Cl.
CPC ....... *G01R 33/3621* (2013.01); *G01R 33/302* (2013.01); *G01R 33/3628* (2013.01); *G01R 33/543* (2013.01); *G01R 33/3607* (2013.01)

(58) Field of Classification Search
CPC ............. G01R 33/3621; G01R 33/543; G01R 33/302; G01R 33/3607; G01R 33/3628; G01R 33/36; G01R 33/54; G01R 33/30
See application file for complete search history.

(56) References Cited

U.S. PATENT DOCUMENTS

| 6,160,400 | A | 12/2000 | Friedrich et al. |
| 2010/0321020 | A1 | 12/2010 | DeVries et al. |
| 2013/0154635 | A1 | 6/2013 | Mandal et al. |

FOREIGN PATENT DOCUMENTS

| JP | 2005296459 | 10/2005 |
| WO | 2015066005 | 5/2015 |

OTHER PUBLICATIONS

International Search Report and Written Opinion, International Application No. PCT/US2018/024325, dated Jul. 19, 2018, 11 pages.

*Primary Examiner* — Patrick Assouad
*Assistant Examiner* — Suresh K Rajaputra
(74) *Attorney, Agent, or Firm* — Morgan, Lewis & Bockius LLP (57) ABSTRACT

Various approaches of receiving signals in integrated circuitry include implementing two successive stages of signal manipulation and employing an interface having an AC coupling network and buffer circuits for decoupling the output impedance and common-mode level of the first stage of signal manipulation from the input impedance and common-mode level of the second stage of signal manipulation without degrading the performance of either stage.

20 Claims, 8 Drawing Sheets

RECONFIGURABLE ANALOG FRONT-END FOR INTEGRATED RECEIVER AND SENSOR APPLICATIONS

CROSS-REFERENCE TO RELATED APPLICATION

This application claims priority to and the benefit of, and incorporates herein by reference in its entirety, U.S. Provisional Patent Application No. 62/476,981, which was filed on Mar. 27, 2017.

FIELD OF THE INVENTION

The field of the invention relates, generally, to a sensor in integrated circuitry for receiving signals and, more particularly, to an integrated receiver in a nuclear magnetic resonance (NMR) system that allows various analog front-end configurations to be assembled quickly and easily.

BACKGROUND

An NMR system generally includes transceiver circuits for transmitting signals to a tested sample and receiving echo signals therefrom and a processor for analyzing the echo signals in order to obtain imaging and/or material information of the sample. Recently, significant efforts have been devoted to miniaturize traditional NMR systems, in particular NMR transceivers. The numerous advantages of miniaturization include low cost, portability, and the fact that a micro-coil tightly surrounding a small size sample increases the signal quality.

Figure 1:
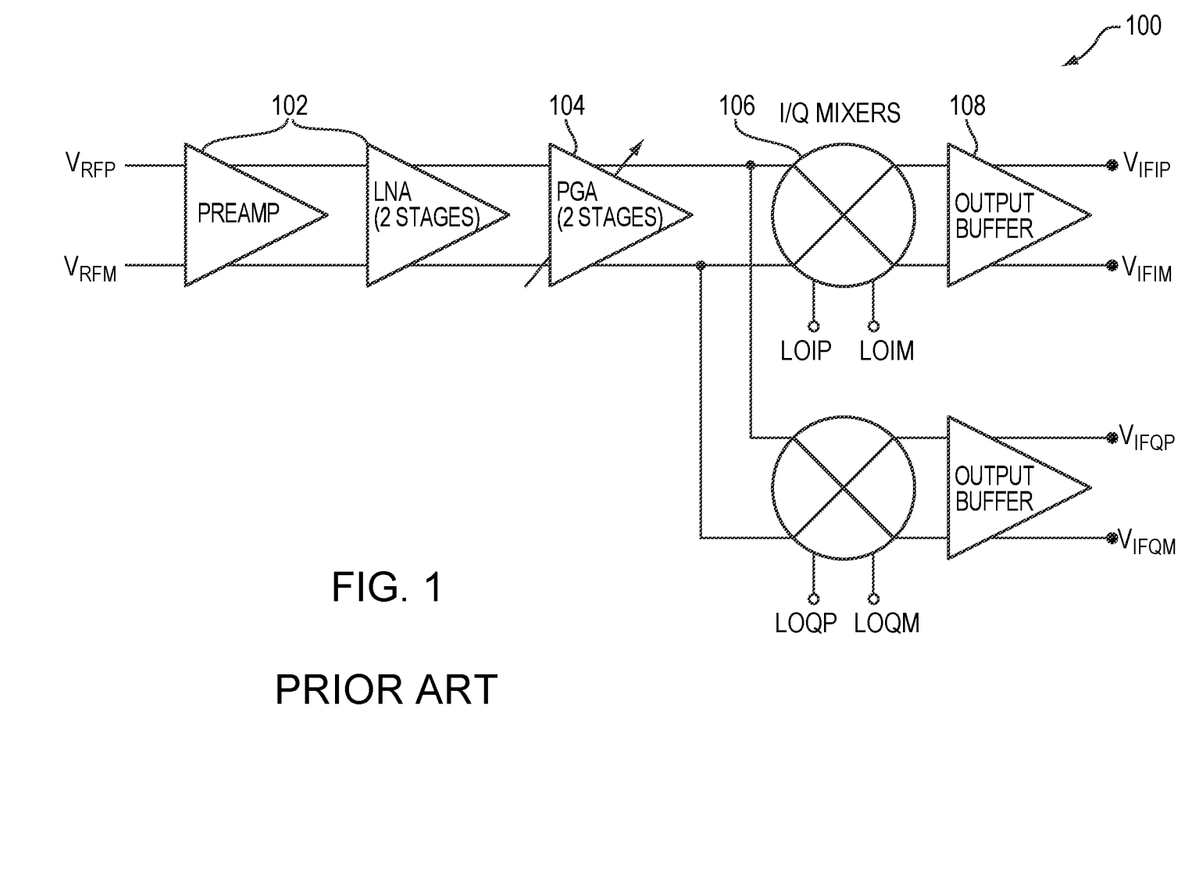
FIG. 1 schematically depicts an architecture of an RF receiver in accordance with the prior art.

The practical design and construction of miniaturized NMR transceiver circuits, however, may present a number of difficulties. For example, it may be challenging to design an interface between multiple components in a radio-frequency (RF) receiver that provides the overall gain, bandwidth, noise figure and other parameters without degrading the performance when the components are connected. FIG. 1 illustrates an architecture of a conventional RF receiver 100 that includes several stages of amplification: a first stage 102 sets the overall noise performance of the receiver and a second stage 104 provides a certain amount of programmable gain to optimize the dynamic range of the analog-to-digital converter (ADC) used to digitize the output of the receiver. In addition, the RF receiver may incorporate a mixer 106 to down-convert the input signal to a lower frequency in order to relax the requirements on the ADC, and a combination of amplification, filtering, and buffering 108 may be employed following the mixer 106 to drive the ADC.

The receiver architecture described above can be implemented in either discrete or integrated form and is applicable to many other applications besides RF. In discrete implementations, the input and output impedance are typically matched to 50Ω to standardize the interface between different off-the-shelf components. This, however, is not practical for integrated solutions due to size and power constraints. Instead, most integrated solutions require the interface between the components to be custom designed for each chip. This leads to design burdens and increases in cost that can make it impractical to quickly reconfigure the receiver architecture to meet the needs of different applications.

Accordingly, there is a need for an approach that provides a standardized interface between individual components of an integrated receiver to allow different analog front-end configurations to be assembled quickly from a set of standard building blocks. Such an interface preferably does not degrade performance of the overall gain, bandwidth, noise figure and other parameters of each analog front-end configuration when connected.

SUMMARY

Embodiments of the present invention provide an approach for implementing a standard interface connecting different components in an integrated sensor (e.g., an RF receiver). Interface embodiments of the present invention include circuits that allow each component to "see" similar electrical properties at its input and output; different components may thus be assembled quickly from a set of standard building blocks using the interface and can be easily reconfigured to meet the needs of a wide range of applications and operating conditions. Accordingly, the approach described herein provides an easily reconfigurable receiver architecture and greatly reduces the design burden.

In various embodiments, the interface includes an alternating-current (AC) coupling network and buffer circuits that may precede or follow the AC coupling network. In one implementation, the buffer circuits include source followers; the low input capacitance and output impedance of the source-follower buffers may decouple the tradeoff between the output impedance and input impedance of two successive stages in the sensor and thus advantageously allow each stage to be optimized for noise, gain, bandwidth and power, independent of a subsequent stage. Similarly, the AC coupling network may decouple the output and input common-mode level (e.g., voltage level or current level) of each stage, thereby allowing the output common-mode level (e.g., voltage level or current level) of each stage to be optimized for performance without the need for considering the requirements of a subsequent stage in the integrated sensor/receiver. In addition, the AC coupling network of the interface may remove a direct-current (DC) offset between two stages; this may eliminate the need for offset trim circuits to prevent the DC offset from saturating the output of the sensor/receiver. In some embodiments, the sizes of the capacitors in the AC coupling network are optimized based on the bandwidth requirements of the application so as to achieve an area-efficient design; this is particularly beneficial for parallel applications where multiple analog front-ends are required. In one implementation, the input devices of each stage of the sensor/receiver are biased at the same level using the interface; this allows the architecture design of the sensor/receiver to be simplified.

In one embodiment, one or more switches are employed in one or more stages of the sensor/receiver to provide a coarse gain adjustment for extending the overall programmable gain of the sensor/receiver. To avoid capacitance introduced by the switch(es), the AC coupling network and buffer circuits of the interface may be implemented between successive stages. In some embodiments, the interface is integrated with a mixer (e.g., a voltage-mode passive mixer) for decoupling the driving requirements of the mixer switches from a preceding amplifier (e.g., a programmable-gain amplifier (PGA)). As a result, the same PGA may be used for both stages in a PGA component of the receiver even when the driving requirements of the blocks following them differ.

Further, in some embodiments, the interface is introduced between stages to allow multiple front-end components of the sensor/receiver to connect in parallel to a common component without affecting the performance of each individual component. The interface may prevent the output stage of each front-end component from loading other front-end components and allow the unused front-end components to be disconnected from the common component by simply powering them down; this approach advantageously obviates the need of a switch network implemented in a conventional approach.

In addition, utilizing the interface, a single front-end component may drive multiple parallel components in the sensor/receiver without redesigning the interface therebetween. This architecture may be particularly beneficial in an NMR system for allowing multiple frequencies within the received NMR signals to be analyzed simultaneously. It should be noted that NMR is an exemplary application that may benefit from implementing the reconfigurable sensor/receiver architecture. One of ordinary skill in the art, however, will understand that any suitable sensors and/or applications may implement the sensor/receiver architecture described herein and are thus within the scope of the invention.

Accordingly, in one aspect, the invention pertains to a sensor for receiving signals in integrated circuitry. In various embodiments, the sensor includes circuitry for applying two or more successive stages of manipulation to the received signals; and an interface having an AC coupling network and buffer circuits for decoupling an output impedance and the first common-mode level of the first one of the successive stages from an input impedance and the second common-mode level of the second one of the successive stages without degrading the performance of either stage. In one implementation, the buffer circuits include source followers. In addition, the AC coupling network includes one or more capacitors and one or more resistors.

In one embodiment, the successive stages include one stage of amplification and one stage of frequency conversion. The stage of amplification may include a programmable-gain amplifier. In addition, the stage of frequency conversion may include a voltage-mode passive mixer. In another embodiment, the successive stages include two stages of amplification. The sensor may include one or more switches connected to one or more of the successive stages for providing a gain adjustment. In addition, the sensor may further include circuitry for applying the third stage of signal manipulation to the received signals; the third stage and the first one of the successive stages may connect in parallel, via the interface, to the second one of the successive stages. In some embodiments, the third stage and the first one of the successive stages include amplification stages and the second one of the successive stages includes a frequency-conversion stage. Alternatively, the third stage and the first one of the successive stages may include frequency-conversion stages and the second one of the successive stages may include an amplification stage.

In another aspect, the invention relates to an NMR apparatus including an NMR coil configured to enclose a sample; a receiver for receiving NMR signals from the sample, the receiver having (i) circuitry for applying two or more successive stages of manipulation to the received NMR signals, and (ii) an interface including an AC coupling network and buffer circuits for decoupling an output impedance and the first common-mode level of the first one of the two successive stages from an input impedance and the second common-mode level of the second one of the two successive stages without degrading the performance of either stage; and a controller configured to analyze the received NMR signals. In one implementation, the buffer circuits include source followers. In addition, the AC coupling network may include one or more capacitors and one or more resistors.

In one embodiment, the successive stages include one stage of amplification and one stage of frequency conversion. The stage of amplification may include a programmable-gain amplifier. In addition, the stage of frequency conversion may include a voltage-mode passive mixer. In another embodiment, the successive stages include two stages of amplification. The NMR apparatus may include one or more switches connected to one or more of the successive stages for providing a gain adjustment. In addition, the NMR apparatus may further include circuitry for applying the third stage of signal manipulation to the received NMR signals; the third stage and the first one of the successive stages may connect in parallel, via the interface, to the second one of the successive stages. In some embodiments, the third stage and the first one of the successive stages include amplification stages and the second one of the successive stages includes a frequency-conversion stage. Alternatively, the third stage and the first one of the successive stages may include frequency-conversion stages and the second one of the successive stages may include an amplification stage.

Another aspect of the invention relates to a method of receiving signals in integrated circuitry. In various embodiments, the method includes providing two or more successive stages of signal manipulation; and providing an interface for decoupling an output impedance and the first common-mode level of the first one of the successive stages from an input impedance and the second common-mode level of the second one of the successive stages without degrading the performance of either stage.

In general, as used herein, the term "degradation" means a loss of more than 10%, and in some embodiments, 20%, of the amplitude of the gain, bandwidth, noise figure and/or other parameters of the electronic components. Further, reference throughout this specification to "one example," "an example," "one embodiment," or "an embodiment" means that a particular feature, structure, or characteristic described in connection with the example is included in at least one example of the present technology. Thus, the occurrences of the phrases "in one example," "in an example," "one embodiment," or "an embodiment" in various places throughout this specification are not necessarily all referring to the same example. Furthermore, the particular features, structures, routines, steps, or characteristics may be combined in any suitable manner in one or more examples of the technology. The headings provided herein are for convenience only and are not intended to limit or interpret the scope or meaning of the claimed technology.

BRIEF DESCRIPTION OF THE DRAWINGS

In the drawings, like reference characters generally refer to the same parts throughout the different views. Also, the drawings are not necessarily to scale, with an emphasis instead generally being placed upon illustrating the principles of the invention. In the following description, various embodiments of the present invention are described with reference to the following drawings, in which.

DETAILED DESCRIPTION

Figure 2A:
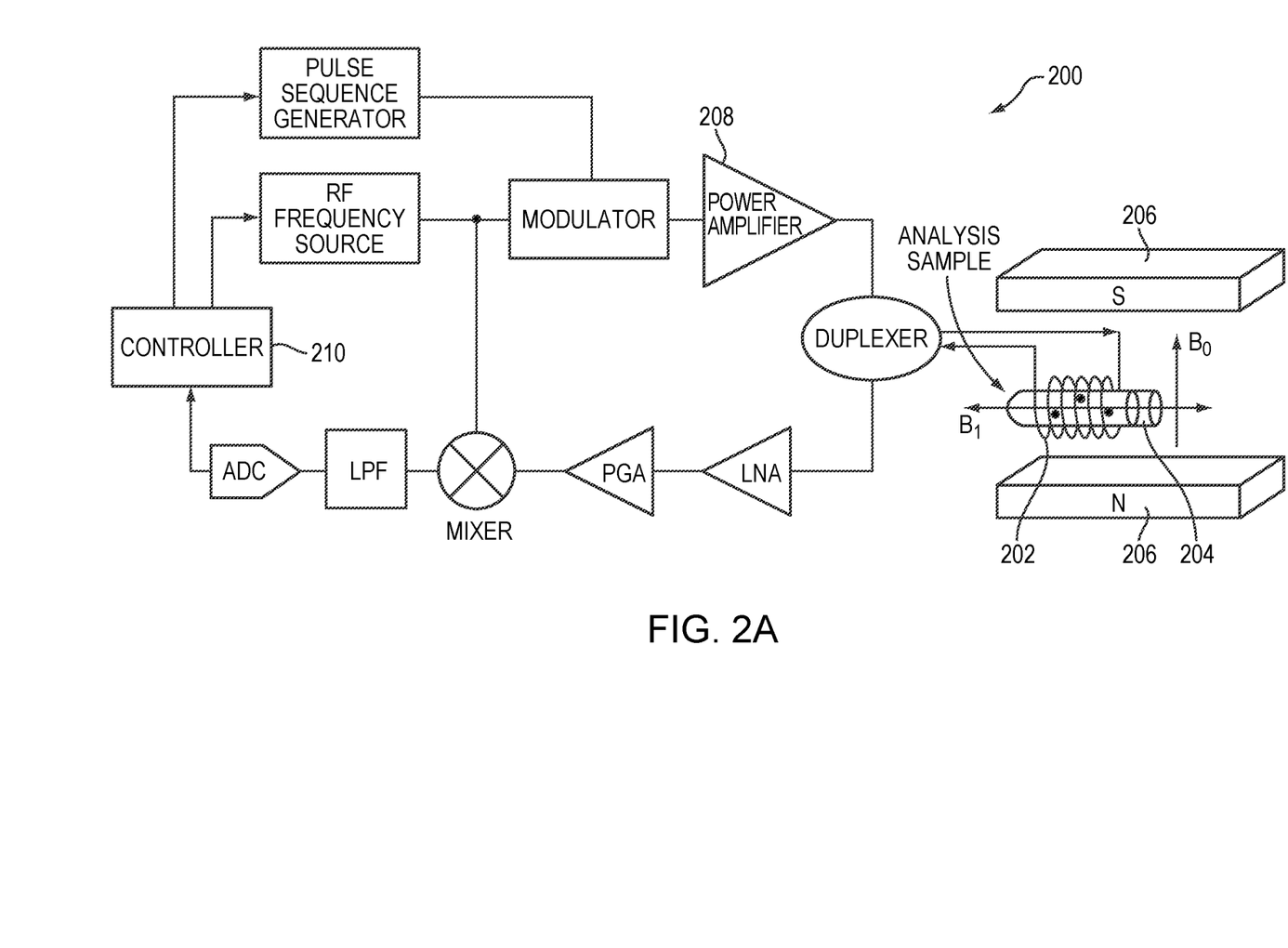
FIGS. 2A-2C schematically illustrate an exemplary NMR system in accordance with various embodiments.

A sensor generally detects events or changes in its environment and sends the information to other electronics for analysis. For example, an NMR system may include an RF receiver to detect echo signals from a sample and subsequently transmit the signals to a processor for analyzing imaging and/or material information of the sample. FIG. 2A illustrates an exemplary NMR system 200 in accordance with various embodiments of the present invention including an NMR coil 202 surrounding a sample 204 being analyzed, a magnet 206 for generating a static magnetic field across the sample 204 and the coil 202, an RF transceiver 208 coupled to the NMR coil 202, and a controller 210 for controlling operation of the RF transceiver 208. In one implementation, with reference to FIGS. 2B and 2C, the transceiver 208 includes a transmitter (Tx) portion 212 for generating and transmitting RF signals to the sample 204 and a receiver (Rx) portion 214 for receiving echo signals from the sample 204.

Figure 2B:
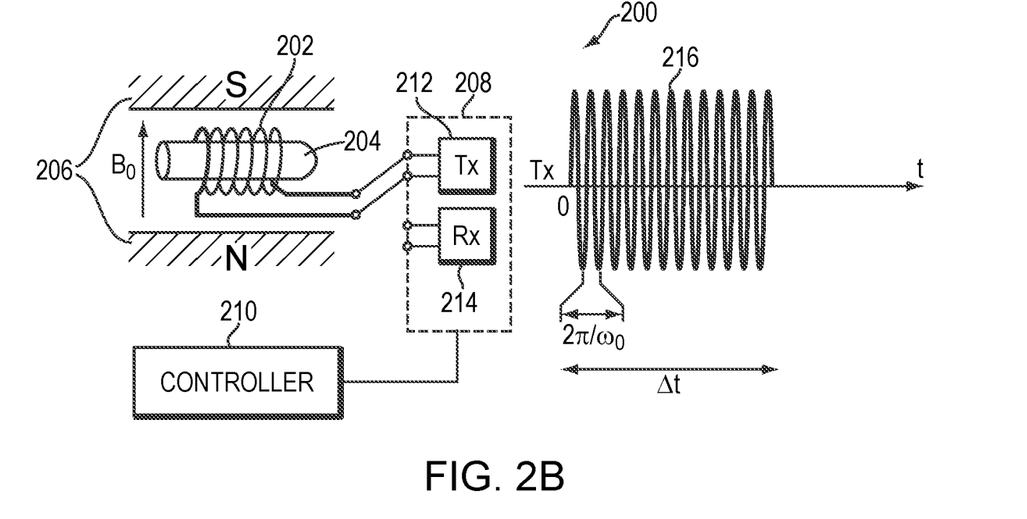

During NMR measurements, the magnet 206 is activated to generate a substantially homogeneous magnetic field $B_0$ (e.g., within 0.1 parts per million (ppm) or, in some embodiments, within 100 ppm) across the sample 204; individual magnetic moments of the spins in the sample 204 may attempt to align with the applied field $B_0$. As a result, the magnetic moments of all the nuclei in the sample sum to a net magnetic moment that precesses about the axis of the field $B_0$ at a characteristic Larmor frequency, $\omega_0$, satisfying $\omega_0 = \gamma B_0$, where $\gamma$ is a gyromagnetic ratio. Because different nuclei have different values of the gyromagnetic ratio, measuring the Larmor frequency of the sample 204 allows material properties (e.g., the chemical composition) of the sample 204 to be revealed. In various embodiments, to observe precession of the net magnetic moment, the controller 210 causes the transmitter 212 to transmit an RF signal 216 (typically comprising a pulse sequence) having a resonant frequency substantially close (e.g., within ±1%) to the Larmor frequency $\omega_0$ to the coil 202; the coil 202 then generates an RF magnetic field that causes the net magnetic moment of the nuclei in the sample 204 to be "tipped" away from the axis of the static field $B_0$. Typically, the RF magnetic field has a time-dependent magnitude and is generated in a plane perpendicular to the axis of the static field $B_0$.

Figure 2C:
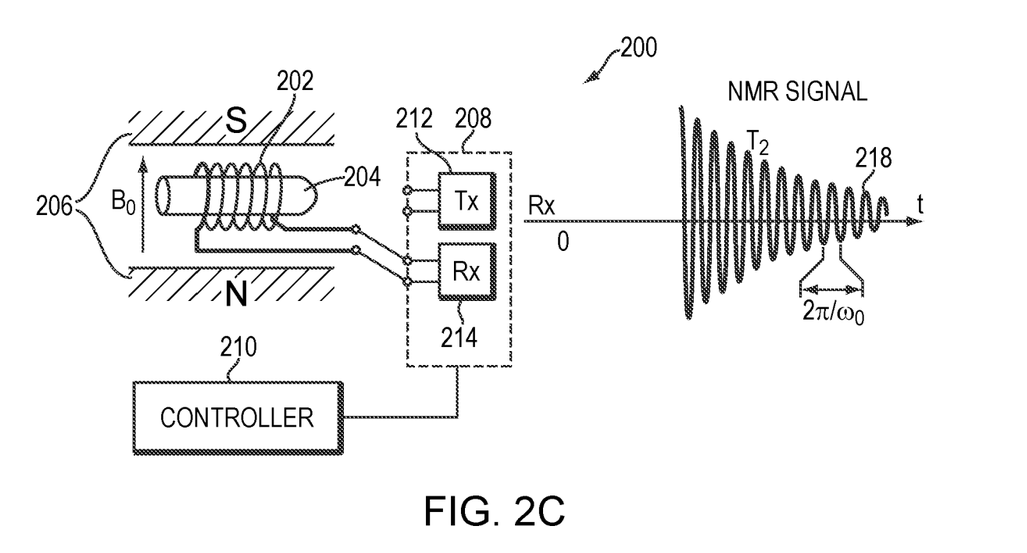

Referring to FIG. 2C, after a predetermined time duration, $\Delta t$, the transmitter 212 stops transmission of the RF excitation signal 216, and the coil 202 is switched via, for example, a mechanical switch or an electrical switch (e.g., a transistor) to the receiver 214 for receiving the echo signals from the sample 204. Upon stopping the RF excitation, the nuclear spins within the sample 204 precess around the $B_0$-axis at the Larmor frequency $\omega_0$; this induces a corresponding signal oscillation. The nuclear spins then slowly lose phase coherence via spin-spin interactions, which manifest themselves in a macroscopic average as an exponential relaxation or damping signal 218 (referred to as "free induction decay") in the precession of the net magnetic moment. The oscillation and relaxation of the NMR signal can be detected by the coil 202. Because the spin-spin interactions are peculiar to the material of the sample 204 being tested, the characteristic time, commonly referred to as $T_2$, of the relaxation signal is also material-specific. Thus, by measuring the Larmor frequency $\omega_0$ (e.g., for spectroscopy) and/or characteristic time $T_2$ (e.g., for relaxometry), NMR techniques can be used as an analytic tool in a number of fields, including but not limited to chemical composition analysis, medical imaging, and bio-sensing. An exemplary NMR system is described in U.S. Pat. No. 8,643,368, the entire disclosure of which is hereby incorporated by reference.

Figure 3A:
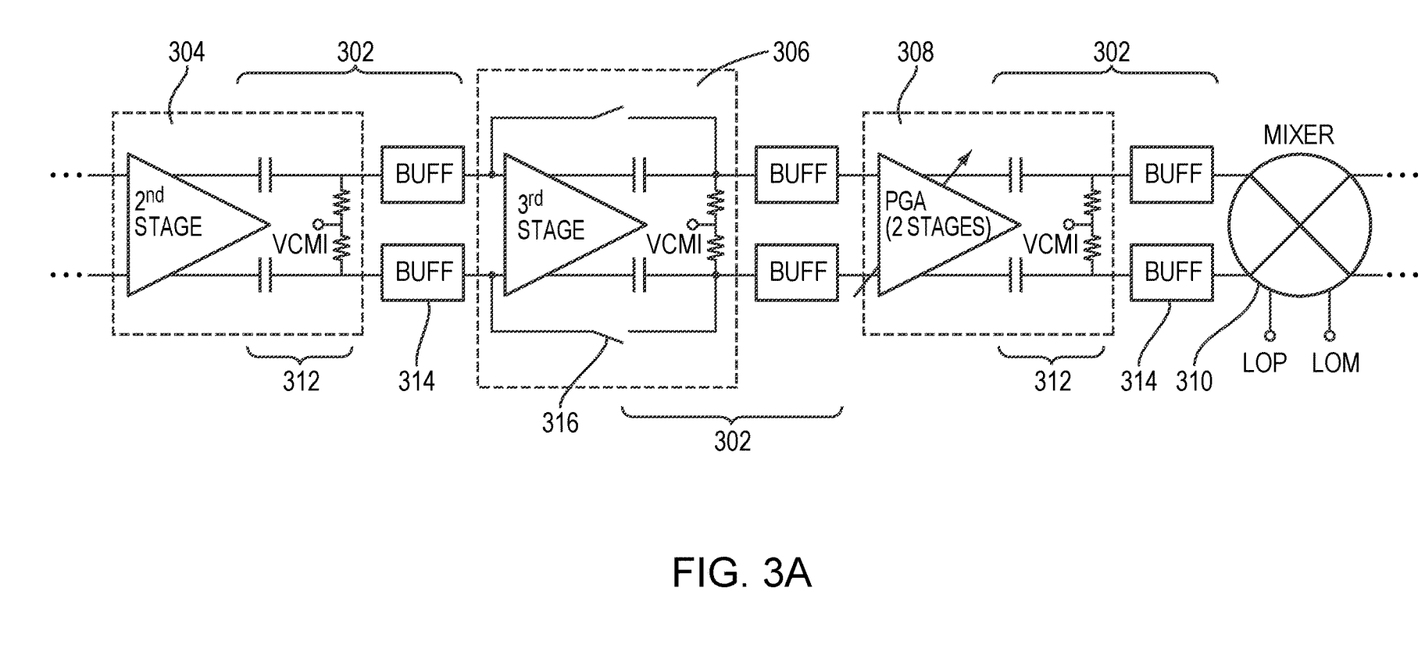
FIG. 3A schematically depicts an exemplary standardized interface connecting various components (or stages) of a sensor/receiver in accordance with various embodiments.

In NMR applications, the strength and size of the magnet 206 as well as the sample size may vary widely from one NMR device to another. Therefore, a flexible architecture that can easily adapt to the resulting changes in bandwidth, gain, and other requirements of the receiver 214 may advantageously reduce design time and cost, and allow the receiver performance to be optimized for each NMR device. Various embodiments of the present invention particularly address the concerns for integrated solutions where the area and power of the receiver are at a premium. For example, referring to FIG. 3A, an exemplary standardized interface 302 may be implemented to connect different components (or stages) 304-310 of an RF receiver. In one implementation, the interface 302 includes an AC coupling network 312 and buffer circuits 314 between two components (e.g., between two stages of amplification 304, 306 or between one stage of amplification 308 and one stage of frequency conversion 310). Although the implementation depicted in FIG. 3A is fully differential, it may also be single-ended without a loss of generality. In addition, it should be noted that in some embodiments, all pairs of successive stages in the RF receiver are decoupled using the interface 302 (as depicted in FIG. 3A). Further, the interface 302 described herein may not be limited to RF receivers or NMR applications only; it may be implemented in any analog front-end structures used in various sensors.

Figure 3B:
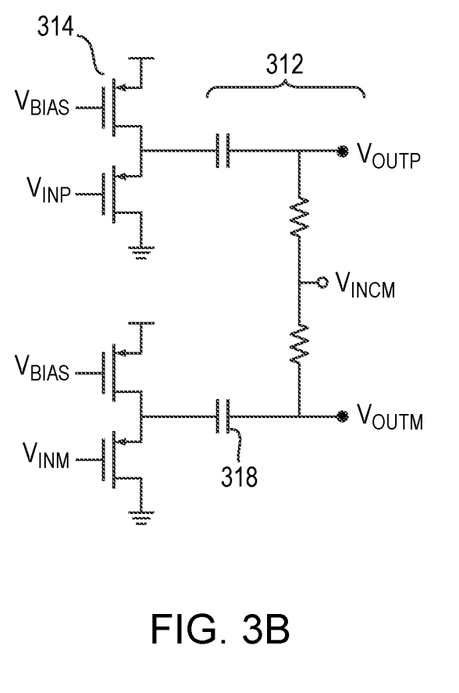
FIG. 3B schematically illustrates an architecture of an exemplary standardized interface implemented between various components (or stages) of a sensor/receiver in accordance with various embodiments.

Referring to FIG. 3B, in various embodiments, the buffer circuits 314 include source followers and may precede or follow the AC coupling network 312. The low input capacitance and output impedance of the source-follower buffers 314 may decouple the tradeoff between the output impedance and input impedance of two successive stages and thus advantageously allows each stage to be optimized for noise, gain, bandwidth, and power, among other parameters, independent of a subsequent stage. Similarly, the AC coupling network 312 may decouple the output and input common-mode level of each stage. This design may allow the output common-mode level of each stage to be optimized for performance without the need to conform to the requirements of a subsequent stage. In addition, standardizing the input common-mode level (e.g., voltage level or current level) of each stage using this architecture may allow the input devices of each stage to be biased at the same level, thereby simplifying the overall design. Further, the AC coupling network 312 may remove a DC offset between two stages of the receiver, thus eliminating the need for the offset trim circuits that are employed in a conventional receiver to prevent the offset from saturating the output. In various embodiments, the size of the capacitor 318 in the AC coupling is optimized based on the bandwidth requirements of the application; this provides further advantages in achieving an area-efficient receiver design. Accordingly, the interface 302 may be particularly beneficial for parallel applications where multiple analog front-ends are required.

Referring again to FIG. 3A, in various embodiments, one or more switches 316 may be employed in one or more stages of the RF receiver. For example, the switches 316 may be added around the third gain stage 306 to bypass it and drop the overall gain of the receiver by 20 dB. This provides a coarse gain adjustment to extend the overall programmable gain of the receiver and may be beneficial for applications, such as NMR, where the input signal strength may vary widely. The bypass switches 316 may, however, introduce capacitance; as a result, in conventional designs the output stage of the second stage amplifier 304 is redesigned to avoid degrading the bandwidth. In contrast, various embodiments of the present invention utilize the interface 302 including the AC coupling network 312 and buffer circuits 314 to decouple the introduced capacitance of the third stage 306 from the second stage 304, thereby obviating the need to redesign the second stage 304. In addition, the interface 302 provides another benefit: the same amplifier may be used in successive stages without compromising its performance even when the input impedance of the subsequent stages is different.

Figure 4:
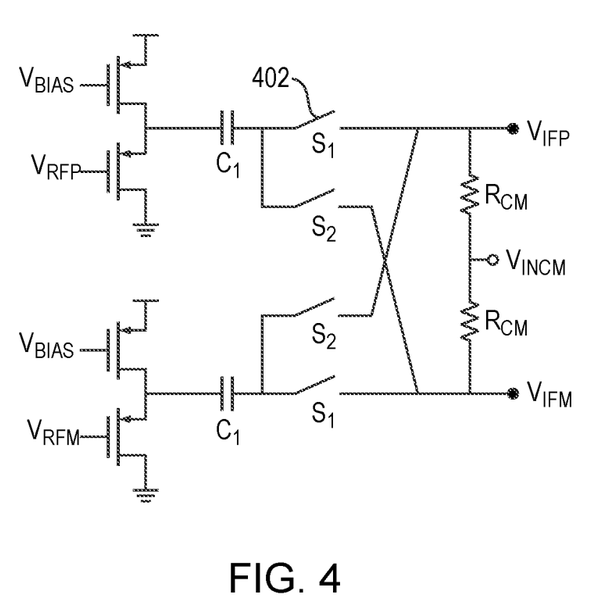
FIG. 4 schematically depicts an exemplary standardized interface integrated with a mixer of a receiver in accordance with various embodiments.

Referring to FIG. 4, in various embodiments, the interface 302 having the AC coupling network 312 and source follower buffers 314 is integrated with a mixer (e.g., a voltage-mode passive mixer) 402. The interface 302 may decouple the driving requirements of the mixer switches 402 from a preceding PGA as shown in FIG. 3A. Accordingly, the same PGA may be used for both stages in the PGA component 308 even when the driving requirements of the blocks following them differ.

Figure 5:
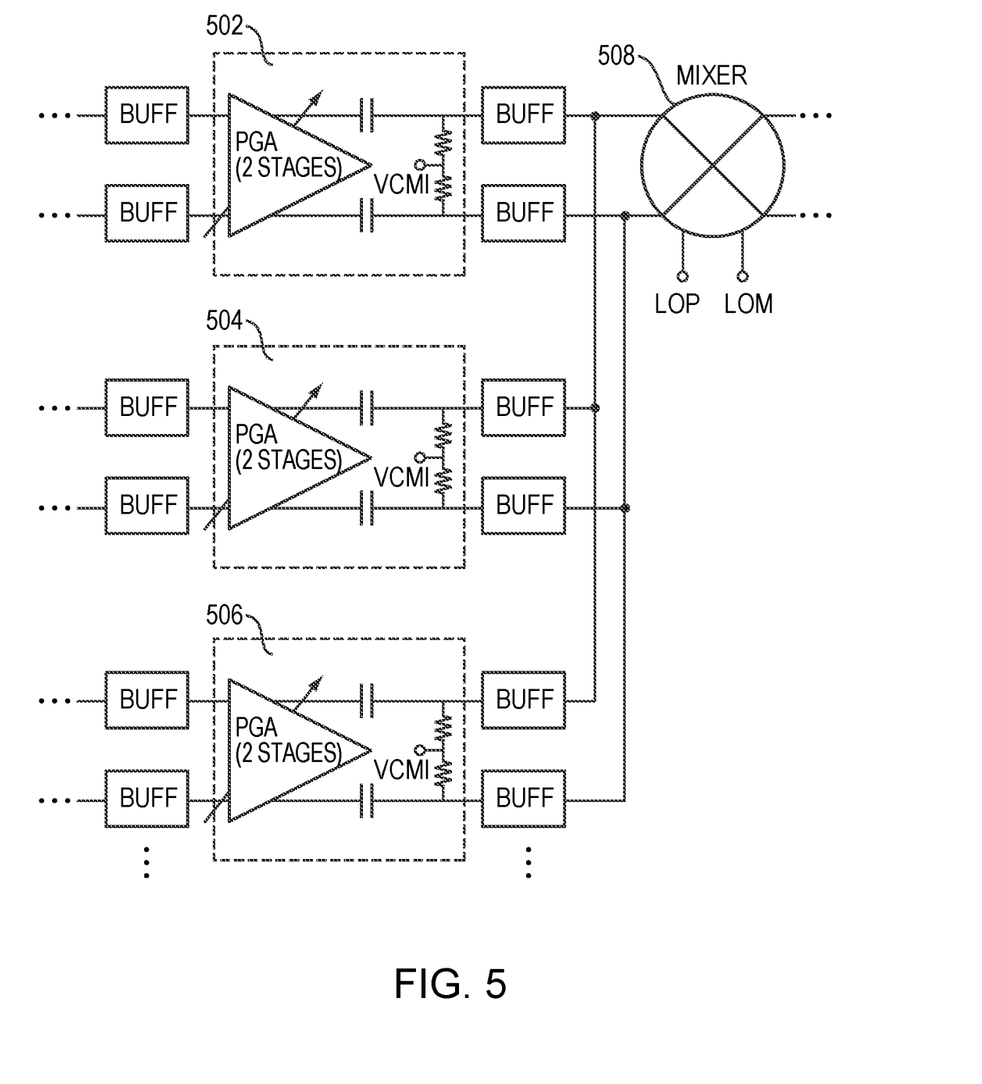
FIG. 5 schematically depicts multiple front-end components of a receiver connected in parallel with the same component via exemplary standardized interfaces in accordance with various embodiments.

In some embodiments, the interface 302 having the AC coupling network 312 and source follower buffers 314 as described herein is introduced between stages to allow multiple components of a sensor (e.g., an RF receiver) to connect in parallel to a common component without affecting the performance of each individual component. For example, referring to FIG. 5, multiple front-end components 502-506 may be connected in parallel and share the same mixer 508. The AC coupling network 312 and buffers 314 prevent the output stage of each front-end component from loading each other and allow the unused front-end components to be disconnected from the mixer 508 by simply powering them down; this approach obviates the need for a conventional switch network to select one of the components 502-506 to connect to the mixer 508. Accordingly, this design may advantageously save power, area and design time. In an NMR system, this implementation may be suitable for analyzing multiple samples in parallel while sharing the same mixer and ADC.

Figure 6:
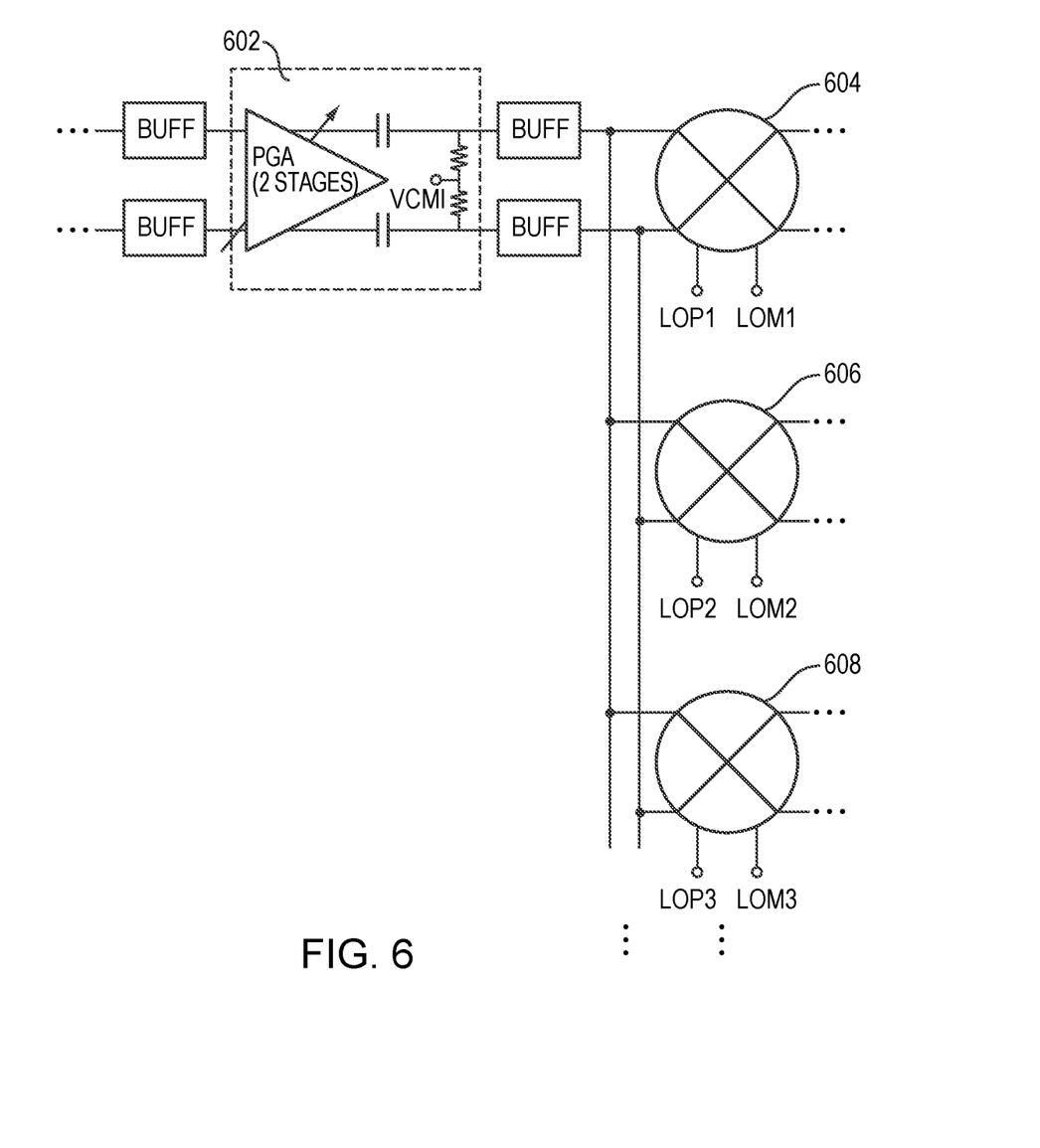
FIG. 6 schematically depicts a PGA of a receiver connected to multiple parallel mixers via an exemplary standardized interface in accordance with various embodiments.

In addition, utilizing the interface 302, a single front-end component may drive multiple parallel components in an RF receiver or other sensors. For example, referring to FIG. 6, the interface 302 having the AC coupling network 312 and buffers 314 may connect the final PGA 602 to multiple parallel mixers 604-608 without causing performance degradation of the PGA 602 due to the added load of the multiple mixers 604-608. This design thus obviates the need to redesign the PGA 602 or the interface between the PGA 602 and the mixers 604-608. In an NMR system, this architecture may advantageously allow multiple frequencies within the received NMR signals to be analyzed simultaneously by independently setting the frequency of the local oscillator (LO) in each mixer.

Accordingly, the interface 302 connecting individual components in an RF receiver or other sensors as described herein may allow different analog front-end configurations to be assembled quickly from a set of standard building blocks, thereby greatly reducing the design time for integrated solutions without compromising performance. In addition, the interface 302 allows the receiver/sensor to be easily reconfigured to adapt to the needs of a wide range of operating conditions and various applications without redesigning the interface between various components.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A sensor for receiving signals in integrated circuitry, the sensor comprising:
   circuitry for applying at least two successive stages of manipulation to the received signals; and
   an interface comprising an AC coupling network and buffer circuits for decoupling an output impedance and a first common-mode level of a first one of the two successive stages from an input impedance and a second common-mode level of a second one of the two successive stages without degrading the performance of either stage.

2. The sensor of claim 1, wherein the buffer circuits comprise source followers.

3. The sensor of claim 1, wherein the AC coupling network comprises at least one capacitor and at least one resistor.

4. The sensor of claim 1, wherein the at least two successive stages comprise one stage of amplification and one stage of frequency conversion.

5. The sensor of claim 4, wherein the stage of amplification comprises a programmable-gain amplifier.

6. The sensor of claim 4, wherein the stage of frequency conversion comprises a voltage-mode passive mixer.

7. The sensor of claim 1, wherein the at least two successive stages comprise two stages of amplification.

8. The sensor of claim 7, further comprising at least one switch connected to at least one of the two stages for providing a gain adjustment.

9. The sensor of claim 1, further comprising circuitry for applying a third stage of signal manipulation to the received signals, wherein the third stage and the first one of the two successive stages connect in parallel, via the interface, to the second one of the two successive stages.

10. The sensor of claim 9, wherein the third stage and the first one of the two successive stages comprise amplification stages and the second one of the two successive stages comprises a frequency-conversion stage.

11. The sensor of claim 9, wherein the third stage and the first one of the two successive stages comprise frequency-conversion stages and the second one of the two successive stages comprises an amplification stage.

12. An NMR apparatus comprising:
an NMR coil configured to enclose a sample;
a receiver for receiving NMR signals from the sample, the receiver comprising (i) circuitry for applying at least two successive stages of manipulation to the received NMR signals, and (ii) an interface comprising an AC coupling network and buffer circuits for decoupling an output impedance and a first common-mode level of a first one of the two successive stages from an input impedance and a second common-mode level of a second one of the two successive stages without degrading the performance of either stage; and
a controller configured to analyze the received NMR signals.

13. The NMR apparatus of claim 12, wherein the buffer circuits comprise source followers.

14. The NMR apparatus of claim 12, wherein the AC coupling network comprises at least one capacitor and at least one resistor.

15. The NMR apparatus of claim 12, wherein the two successive stages comprise one stage of amplification and one stage of frequency conversion.

16. The NMR apparatus of claim 12, wherein the two successive stages comprise two stages of amplification.

17. The NMR apparatus of claim 12, further comprising circuitry for applying a third stage of signal manipulation to the received NMR signals, wherein the third stage and the first one of the two successive stages connect in parallel, via the interface, to the second one of the two successive stages.

18. The NMR apparatus of claim 17, wherein the third stage and the first one of the two successive stages comprise amplification stages and the second one of the two successive stages comprises a frequency-conversion stage.

19. The NMR apparatus of claim 17, wherein the third stage and the first one of the two successive stages comprise frequency-conversion stages and the second one of the two successive stages comprises an amplification stage.

20. A method of receiving signals in integrated circuitry, the method comprising:
providing at least two successive stages of signal manipulation; and
providing an interface for decoupling an output impedance and a first common-mode level of a first one of the two successive stages from an input impedance and a second common-mode level of a second one of the two successive stages without degrading the performance of either stage.

* * * * *